United States Patent
Pushkolli et al.

(10) Patent No.: US 9,007,068 B2
(45) Date of Patent: Apr. 14, 2015

(54) METHOD FOR DETECTING AN ELECTRICAL FAULT IN AN ELECTRICAL NETWORK OF A MOTOR VEHICLE

(75) Inventors: Beqir Pushkolli, Ludwigsburg (DE); Ulrich Klein, Kirchheim/Teck (DE)

(73) Assignee: Robert Bosch GmbH, Stuttgart (DE)

( * ) Notice: Subject to any disclaimer, the term of this patent is extended or adjusted under 35 U.S.C. 154(b) by 1126 days.

(21) Appl. No.: 12/808,879

(22) PCT Filed: Nov. 11, 2008

(86) PCT No.: PCT/EP2008/065310
§ 371 (c)(1),
(2), (4) Date: Oct. 15, 2010

(87) PCT Pub. No.: WO2009/080405
PCT Pub. Date: Jul. 2, 2009

(65) Prior Publication Data
US 2011/0022261 A1    Jan. 27, 2011

(30) Foreign Application Priority Data
Dec. 20, 2007   (DE) .................... 10 2007 061 729

(51) Int. Cl.
*G01R 31/08*   (2006.01)
*G01R 31/00*   (2006.01)
*G01R 31/02*   (2006.01)

(52) U.S. Cl.
CPC ............ *G01R 31/007* (2013.01); *G01R 31/025* (2013.01); *G01R 31/08* (2013.01)

(58) Field of Classification Search
CPC ........ G01R 31/007; B60K 6/48; B60L 11/14; B60L 2210/12; B60L 2210/40; B60L 2240/421

USPC ............ 324/765.01, 522, 139, 722, 436, 120, 324/426, 427, 428, 429, 430, 431, 432, 433, 324/434, 435, 437; 318/490; 320/152, 157, 320/158, 159, 163, 164
See application file for complete search history.

(56) References Cited

U.S. PATENT DOCUMENTS 3,754,221 A * 8/1973 Stelter ........................... 340/651
4,314,193 A * 2/1982 Mortonson ..................... 322/28
(Continued)

FOREIGN PATENT DOCUMENTS

DE       44 47 446      7/1996
DE    10 2004 057693    6/2006
EP       0 502 226      9/1992

*Primary Examiner* — Patrick Assouad
*Assistant Examiner* — Sean Curtis
(74) *Attorney, Agent, or Firm* — Kenyon & Kenyon LLP

(57) ABSTRACT

A method is provided for current-based detection of an electrical fault in an electrical network of a motor vehicle, the network having at least: one battery, one pulse-controlled inverter, one d.c. voltage converter, and an intermediate circuit associated with the pulse-controlled inverter. The method includes: detecting magnitudes of each a battery current, a d.c. voltage converter current, and an intermediate circuit current; comparing current magnitudes according to provided equations; and checking based on the comparison of whether a specifiable deviation has been exceeded. An alternative method for voltage-based detection of an electrical fault in an electrical network of a motor vehicle includes: detecting magnitudes of each a battery voltage, a d.c. voltage converter voltage, and an intermediate circuit voltage; comparing voltage magnitudes according to provided equations; and checking based on the comparison of whether a specifiable deviation has been exceeded.

13 Claims, 2 Drawing Sheets

(56) References Cited

U.S. PATENT DOCUMENTS

| | | | |
|---|---|---|---|
| 4,379,990 A * | 4/1983 | Sievers et al. | 322/99 |
| 5,163,172 A * | 11/1992 | Hakala | 324/111 |
| 5,396,163 A * | 3/1995 | Nor et al. | 320/159 |
| 5,765,664 A * | 6/1998 | Herkel et al. | 187/393 |
| 6,335,574 B1 * | 1/2002 | Ochiai et al. | 290/40 C |
| 6,356,853 B1 * | 3/2002 | Sullivan | 702/117 |
| 6,927,955 B2 * | 8/2005 | Suzui et al. | 361/42 |
| 6,949,921 B1 * | 9/2005 | Feight et al. | 324/127 |
| 7,271,580 B1 * | 9/2007 | Fenske et al. | 324/127 |
| 7,728,537 B2 * | 6/2010 | Tomigashi | 318/400.02 |
| 2003/0228503 A1 * | 12/2003 | Georgii | 429/13 |
| 2004/0239272 A1 * | 12/2004 | Schulz et al. | 318/439 |
| 2005/0231217 A1 * | 10/2005 | Carruthers | 324/691 |
| 2006/0038523 A1 * | 2/2006 | Fujino et al. | 318/600 |
| 2007/0013333 A1 * | 1/2007 | Ajima et al. | 318/432 |
| 2008/0048619 A1 * | 2/2008 | Yoshida | 320/134 |
| 2010/0001523 A1 * | 1/2010 | Sato et al. | 290/31 |

* cited by examiner

METHOD FOR DETECTING AN ELECTRICAL FAULT IN AN ELECTRICAL NETWORK OF A MOTOR VEHICLE

FIELD OF THE INVENTION

The present invention relates to a method for detecting an electrical fault in an electrical network of a motor vehicle, the network having at least one battery, at least one pulse-controlled inverter and at least one d.c. voltage converter, and an intermediate circuit current associated with the pulse-controlled inverter being ascertained with the aid of an intermediate circuit current sensor.

BACKGROUND INFORMATION

There are method for detecting an electrical fault in an electrical network of a motor vehicle. Particularly, in modern motor vehicles having a hybrid drive train, that is, having at least one internal combustion engine and at least one electrical machine mechanically connectable to the internal combustion engine, it is frequently of interest to detect malfunctions or faults in the electrical network, which includes the electrical machine, so as to protect components of the electrical network, in particular the pulse-controlled inverter. Such a network normally also has at least one rechargeable battery and at least one d.c. voltage converter, the battery being used as the voltage source for the electrical machine associated with the pulse-controlled inverter or as an energy store in the generator operating mode of the electrical machine. In the case of a fault or a malfunction, different options for operating the electrical network are known such that for example an emergency operating mode is started or the system shuts down when a fault is detected. In this connection, the current of an intermediate circuit of the electrical network associated with the pulse-controlled inverter is frequently detected with the aid of an intermediate circuit current sensor. Faults in the electrical network, in particular a fault in the intermediate circuit current sensor, may result in false information regarding the operability of the electrical network.

SUMMARY OF THE INVENTION

The method according to the present invention provides for a battery current associated with the battery to be detected with the aid of a battery current sensor and for a d.c. voltage converter current associated with the d.c. voltage converter to be detected with the aid of a d.c. voltage converter current sensor, and for the magnitude of the detected intermediate circuit current to be compared to an intermediate circuit current determined by calculation with the aid of the battery current sensor and the d.c. voltage converter current sensor to check whether or not a specifiable deviation has been exceeded. With the aid of the battery current sensor and the d.c. voltage converter current sensor, the current of the electrical network is detected or measured at two additional locations of the network aside from the intermediate circuit.

The detected battery current and the detected d.c. voltage converter current are compared to the intermediate circuit current detected by the intermediate circuit current sensor, an intermediate circuit current being determined for this purpose by calculation from the battery current and the d.c. voltage converter current, which is compared to the detected intermediate circuit current. If the intermediate circuit current determined by calculation deviates from the detected intermediate circuit current, then a fault is diagnosed in the electrical network. For this purpose, tolerance values are advantageously specified such that the fault is diagnosed only after a deviation specifiable by the tolerance values is exceeded. The advantageous method makes it possible to assess the plausibility of, or to verify the intermediate circuit current measurement such that a fault in the intermediate circuit current sensor may be ruled out when detecting an electrical fault in the electrical network. If a fault is detected, then a power limit is set for the pulse-controlled inverter for example. The d.c. voltage converter may operate as a step-down converter.

According to a further development of the exemplary embodiments and/or exemplary methods of the present invention, the deviation of the determined intermediate circuit current from the detected intermediate circuit current is determined by the following equation, which is based on Kirchhoff's rule:

$$I_{ZK} - I_{Batt} + I_{DCDC} = 0.$$

$I_{ZK}$ is the intermediate circuit current detected by the intermediate circuit current sensor, $I_{Batt}$ is the battery current detected by the battery current sensor, and $I_{DCDC}$ is the d.c. voltage converter current detected by the d.c. voltage converter current sensor. When the electrical machine is operated as a motor, the battery is charged by the electrical machine such that the above equation is valid.

If the electrical machine is operated as a generator, the deviation is suitably determined by the following equation:

$$I_{ZK} - I_{Batt} - I_{DCDC} = 0.$$

According to a further development of the method of the present invention, first the operability of the battery current sensor and/or of the d.c. voltage converter current sensor is ascertained. This may be accomplished using diagnostic programs inside the sensor. Moreover, it is advantageous to check the status of the battery current sensor and/or of the d.c. voltage converter current sensor. Furthermore, it is advantageous to check the network for "signal range check faults" (short circuit to battery, short circuit to ground, power interruption)(of the intermediate circuit current sensor). It is furthermore advantageous to provide for a check as to whether the machine control of the electrical machine is in a suitable mode such as motor operation or generator operation for example.

The present invention relates to a method for detecting an electrical fault in an electrical network of a motor vehicle, the network having at least one battery, at least one pulse-controlled inverter and at least one d.c. voltage converter, and an intermediate circuit voltage associated with the pulse-controlled inverter being detected with the aid of an intermediate circuit voltage sensor. According to the exemplary embodiments and/or exemplary methods of the present invention, the method provides for detecting a d.c. voltage converter voltage associated with the d.c. voltage converter using a d.c. voltage converter voltage sensor and for comparing the magnitude of the determined intermediate circuit voltage with the detected d.c. voltage converter voltage to determine whether a specifiable deviation has been exceeded.

The second method described here thus relates to a voltage-based detection of an electrical fault in the electrical network, in particular the intermediate circuit voltage detected by the intermediate circuit voltage sensor being checked for plausibility. For this purpose, the d.c. voltage converter voltage of the network associated with the d.c. voltage converter is detected with the aid of the d.c. voltage converter voltage sensor. Normally, the d.c. voltage converter voltage should essentially correspond to the intermediate circuit voltage since the d.c. voltage converter sets the intermediate circuit voltage. A fault in the network or a fault in the intermediate circuit voltage sensor may thus be detected by a simple comparison of the detected intermediate circuit voltage and the detected d.c. voltage converter voltage. Advantageously, the difference between the d.c. voltage converter voltage and the detected intermediate circuit voltage is formed for this purpose. The second method thus essentially differs from the previously described method in that it is voltage-based and not current-based.

According to an advantageous further development of the method, a battery voltage associated with the battery is detected using a battery voltage sensor and the magnitude of the detected intermediate circuit voltage is compared with the detected battery voltage to determine whether a specifiable deviation has been exceeded. As in the comparison between the d.c. voltage converter voltage and the intermediate circuit voltage, here too tolerance limits are specified, which define the specifiable deviation. If the detected values or the ascertained deviation exceed the tolerance range, then a fault is diagnosed.

Advantageously, in addition or alternatively, the detected battery voltage is compared with the detected d.c. voltage converter voltage to determine whether a specifiable deviation has been exceeded.

Advantageously, the (first and/or second) method is implemented while the high-voltage loads are deactivated. Expediently, this represents an enabling condition that must be fulfilled so that the method may be carried out. Additionally or alternatively, further enabling conditions are conceivable, which are queried prior to implementing the method:

The operability of the battery voltage sensor and/or the d.c. voltage converter sensor may first be ascertained. This may be accomplished using a diagnostic function inside the sensor for example. In addition, it is advantageous if the functioning of the battery itself is checked by the enabling condition. It is also advantageous if the intermediate circuit voltage sensor is checked for range check faults (short circuit to battery, short circuit to ground, power interruption). As described above, the status of the electrical machine is to be checked as another enabling condition.

In the following, the exemplary embodiments and/or exemplary methods of the present invention shall be described in greater detail with reference to some drawings.

DETAILED DESCRIPTION

Figure 1:
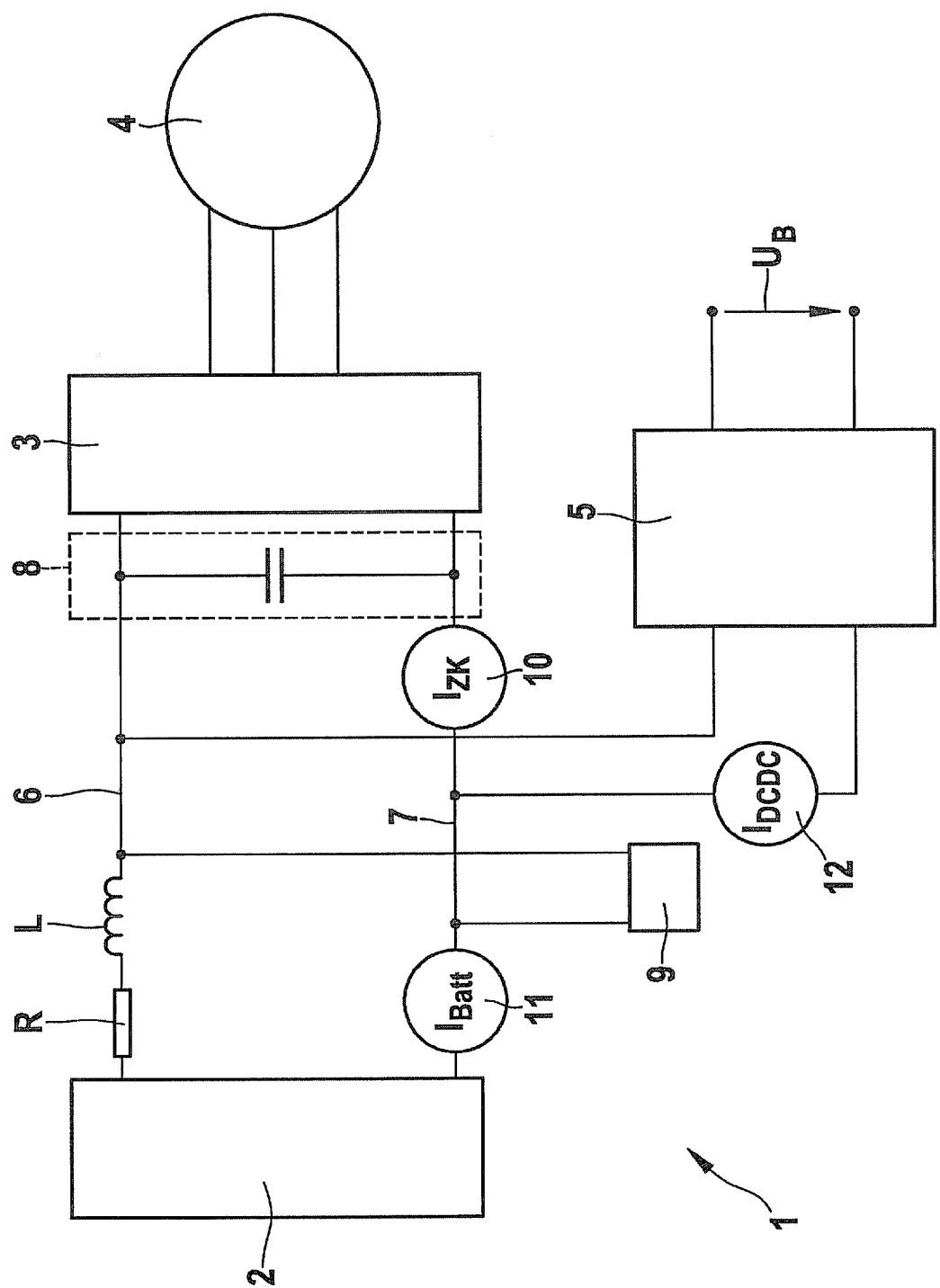
FIG. 1 shows an exemplary embodiment of the method according to the present invention.

FIG. 1 shows an exemplary embodiment of the method according to the present invention in a schematic representation. For this purpose, FIG. 1 shows a simplified circuit diagram of an electrical network 1 of a motor vehicle. Network 1 has a rechargeable battery 2, which is electrically connected to a pulse-controlled inverter 3, which in turn is electrically connected to an electrical machine 4 for the purpose of controlling it. Furthermore, network 1 has a d.c. voltage converter 5, on the one side of which a voltage $U_B$ of an electrical system of the motor vehicle of $U_B$=14 V is applied for example. On another side, d.c. voltage converter 5 is connected to a first electrical line 6 connecting battery 2 with pulse-controlled inverter 3, and to a second line 7 connecting battery 2 with pulse-controlled inverter 3. Between the contact point of the d.c. voltage converter with line 6 and battery 2, a resistor R and an inductor L are provided, which represent the internal losses of network 1. Network 1 furthermore has an intermediate circuit 8 associated with pulse-controlled inverter 3, which is shown here surrounded by a dashed line. Furthermore, additional loads may be assigned to electrical network 1 such as an air conditioning compressor 9 for example.

In operating such a network 1 it is of interest to detect malfunctions or faults in electrical network 1 in order to be able to protect components of the electrical network such as pulse-controlled inverter 3 for example. When detecting a malfunction it is thus possible to switch to an emergency operating mode or to switch off the entire system for example. For detecting malfunctions it is known to detect the intermediate circuit current $I_{ZK}$ of intermediate circuit 8 with the aid of an intermediate circuit current sensor 10. Due to faults in intermediate circuit current sensor 10, however, a malfunction may be determined/detected in error.

In order to verify, or assess the plausibility of, the values provided by intermediate circuit current sensor 10, advantageously a battery current $I_{Batt}$ associated with battery 2 and a d.c. voltage converter current $I_{DCDC}$ associated with d.c voltage converter 5 are detected using a d.c. voltage converter current sensor 12. The magnitude of detected intermediate circuit current $I_{ZK}$ is compared with an intermediate circuit current determined by way of calculation using battery current sensor 11 and d.c. voltage converter current sensor 12 to determine whether a specifiable deviation has been exceeded. Thus, intermediate circuit current $I_{ZK}$ detected by intermediate circuit current sensor 10 is compared with an intermediate circuit current determined by calculation. In particular, a check is performed as to whether the specifiable deviation has been exceeded, which deviation defines a tolerance range within which a deviation of the detected intermediate circuit current $I_{ZK}$ from the calculated intermediate circuit current is regarded as negligible. If the deviation exceeds the specifiable (tolerance) range, however, a fault is diagnosed. If intermediate circuit current sensor 10 detects a correct intermediate circuit current $I_{ZK}$, for example, and if the calculated intermediate circuit current deviates seriously from it, then a fault in network 1 is inferred. If intermediate circuit current sensor 10 reports a critical intermediate circuit current $I_{ZK}$, however, and the calculated intermediate circuit current deviates seriously from it and is located in a range that is favorable or correct for electrical network 1, then a fault in intermediate circuit sensor 10 may be inferred.

The deviation of the detected intermediate circuit current value from the calculated intermediate circuit current value is suitably determined using Kirchhoff's rule:

$$I_{ZK}-I_{Batt}+I_{DCDC}=0.$$

This equation applies particularly to the motor operating mode of electrical machine 4. In the generator operating mode of the electrical machine, by contrast, the following equation is suitably used:

$$I_{ZK}-I_{Batt}+I_{DCDC}=0.$$

In order to exclude other sources of error, the operability of battery current sensor 11 and/or of d.c. voltage converter current sensor 12 is additionally detected using internal processes.

Figure 2:
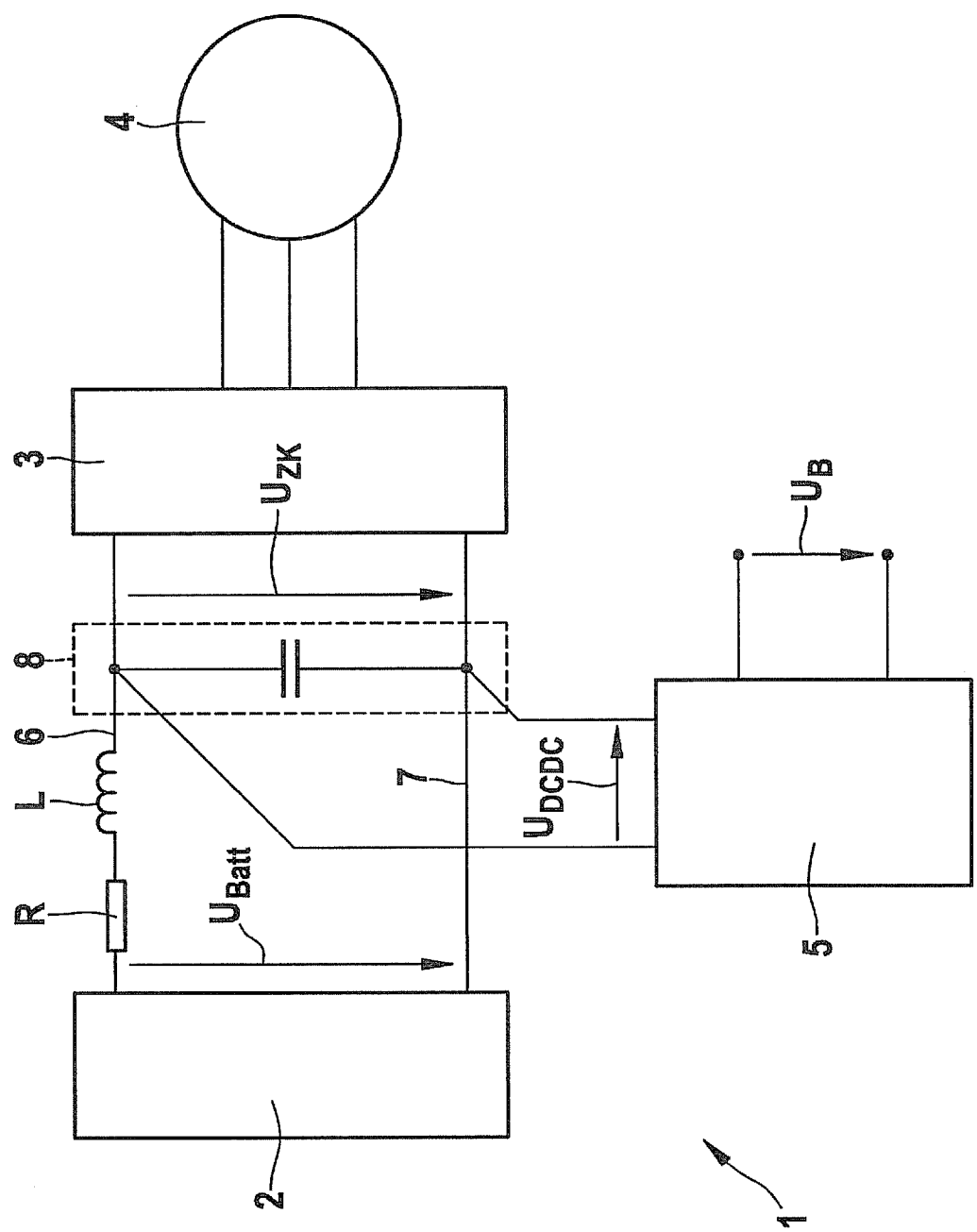
FIG. 2 shows a second exemplary embodiment of the method according to the present invention.

FIG. 2 shows a second exemplary embodiment of an advantageous method for detecting an electrical fault in electrical network 1, which is already known from FIG. 1. Elements known from FIG. 1 are provided here with the same reference symbols and are not explained again.

Essentially, the exemplary embodiment of FIG. 2 differs from the exemplary embodiment of FIG. 1 by the fact that it is not an intermediate circuit current $I_{ZK}$ that is checked for plausibility or verified, but rather the intermediate circuit voltage detected by an intermediate circuit voltage sensor, which is detected for ascertaining a fault in the network. The procedure is as follows:

First, a d.c. voltage converter voltage sensor is used to detect a d.c. voltage converter voltage $U_{DCDC}$ associated with d.c. voltage converter 5 and the magnitude of the detected intermediate circuit voltage $U_{ZK}$ is compared with detected d.c. voltage converter voltage $U_{DCDC}$ in order to check whether a specifiable deviation has been exceeded. Normally, d.c. voltage converter voltage $U_{DCDC}$ should essentially correspond to intermediate circuit voltage $U_{ZK}$. By simply comparing d.c. voltage converter voltage $U_{DCDC}$ with intermediate circuit voltage $U_{ZK}$ it is thus possible to detect a fault of network 1 or of the intermediate circuit voltage sensor in a simple manner. The difference between d.c. voltage converter voltage $U_{DCDC}$ and the detected intermediate circuit voltage $U_{ZK}$ may be formed for this purpose.

In addition, a battery voltage $U_{Batt}$ associated with battery 2 is advantageously detected using a battery voltage sensor and the magnitude of the detected intermediate circuit voltage $U_{ZK}$ is compared to detected battery voltage $U_{Batt}$ to determine whether a specifiable deviation has been exceeded. For this purpose, the specifiable deviation may be chosen in accordance with the deviation described above or may be chosen in deviation from it. If the detected values or the difference of the detected values exceed the tolerance range defined by the specifiable deviation, then a fault is diagnosed in network 1 or in the intermediate circuit voltage sensor, as described above with reference to the current-based method. Furthermore, it is conceivable to compare detected battery voltage $U_{Batt}$ with detected d.c. voltage converter voltage $U_{DCDC}$ to determine whether a specifiable deviation has occurred.

Expediently, the methods described in FIGS. 1 and 2 are carried out while high-voltage loads, such as the air conditioning compressor 9 shown in FIG. 1 for example, are deactivated. This condition advantageously represents one of several enabling conditions that must be fulfilled before the method is implemented.

The operability of the battery voltage sensor and/or of the d.c. voltage converter sensor may be ascertained as additional enabling conditions, for example by using diagnostic functions inside the sensor.

All in all, the advantageous methods for detecting an electrical fault in electrical network 1 of a vehicle make it possible to evaluate the plausibility of the values detected by intermediate circuit current sensor 10 and/or by the intermediate circuit voltage sensor and thus to verify a fault of the network and/or of the sensor detected by the intermediate circuit current sensor or the intermediate circuit voltage sensor so as to avoid an unintended shutdown of the electrical of the motor vehicle.

What is claimed is:

1. A method for detecting an electrical fault in an electrical network of a motor vehicle, the method comprising:
   detecting a battery current associated with at least one battery of the network with the aid of a battery current sensor, wherein the network includes the at least one battery, at least one pulse-controlled inverter, and at least one d.c. voltage converter;
   detecting an intermediate circuit current associated with the pulse-controlled inverter with the aid of an intermediate circuit current sensor;
   detecting a d.c. voltage converter current associated with the d.c. voltage converter with the aid of a d.c. voltage converter current sensor;
   calculating an intermediate circuit current with the aid of only the following current sensors: the battery current sensor and the d.c. voltage converter current sensor; and
   comparing a magnitude of the detected intermediate circuit current with the calculated intermediate circuit current; and
   checking, based on the comparing, whether a specifiable deviation between the detected intermediate circuit current and the calculated intermediate circuit current has been exceeded.

2. The method of claim 1, wherein Kirchhoff's rule is used to determine the deviation.

3. The method of claim 1, wherein the deviation, in a motor operating mode of an electrical machine associated with the pulse-controlled inverter, is determined using the equation $I_{ZK}-I_{Batt}+I_{DCDC}=0$, where $I_{ZK}$ is the detected intermediate circuit current, $I_{Batt}$ is the detected battery current, and $I_{DCDC}$ is the detected d.c. voltage converter current.

4. The method of claim 1, wherein the deviation, in a generator operating mode of an electrical machine associated with the pulse-controlled inverter, is determined using the equation $I_{ZK}-I_{Batt}-I_{DCDC}=0$, where $I_{ZK}$ is the detected intermediate circuit current, $I_{Batt}$ is the detected battery current, and $I_{DCDC}$ is the detected d.c. voltage converter current.

5. The method of claim 1, wherein the operability of at least one of the battery current sensor and the d.c. voltage converter current sensor is first ascertained.

6. The method of claim 1, wherein the detecting the battery current;
   the detecting the intermediate circuit current; the detecting the d.c. voltage converter current;
   the comparing the magnitude of the detected intermediate circuit current with the intermediate circuit current; and
   the checking, based on the comparing, whether a specifiable deviation has been exceeded, are implemented while high-voltage loads are deactivated.

7. A method for detecting an electrical fault in an electrical network of a motor vehicle, the method comprising:
   detecting an intermediate circuit voltage associated with at least one pulse-controlled inverter of the network with the aid of an intermediate circuit voltage sensor, wherein the network includes at least one battery, the at least one pulse-controlled inverter, and at least one d.c. voltage converter;
   detecting, with a d.c. voltage converter voltage sensor, a d.c. voltage converter voltage associated with the d.c. voltage converter;
   comparing a magnitude of the detected intermediate circuit voltage with the detected d.c. voltage converter voltage;
   checking, based on the comparing, whether a specifiable deviation between the detected intermediate circuit voltage and the detected d.c. voltage converter voltage has been exceeded; and
   responsive to the checking indicating that the specifiable deviation has been exceeded, operating a d.c. voltage converter to set, at the intermediate circuit, a power limit for the at least one pulse-controlled inverter.

8. The method of claim 7, wherein Kirchhoff's rule is used to determine the deviation.

9. The method of claim 7, wherein a battery voltage sensor is used to detect a battery voltage associated with the battery, and wherein the magnitude of the detected intermediate circuit voltage is compared with the detected battery voltage to check whether the specifiable deviation has been exceeded.

10. The method of claim 7, wherein a detected battery voltage is compared with the detected d.c. voltage converter voltage to check whether the specifiable deviation has been exceeded.

11. The method of claim 7, wherein the detecting the intermediate circuit voltage; the detecting the d.c. voltage converter voltage; the comparing the magnitude of the detected intermediate circuit voltage with the detected d.c. voltage converter voltage;
and the checking, based on the comparing, whether a specifiable deviation has been exceeded, are implemented while high-voltage loads are deactivated.

12. The method of claim 9, wherein the operability of at least one of the battery voltage sensor and the d.c. voltage converter voltage sensor is first ascertained.

13. The method of claim 1, further comprising:
responsive to the checking indicating that the specifiable deviation has been exceeded, operating a d.c. voltage converter to set, at the intermediate circuit, a power limit for the at least one pulse-controlled inverter.

* * * * *